United States Patent
Koyanagi

(10) Patent No.: US 6,489,910 B1
(45) Date of Patent: Dec. 3, 2002

(54) OVERSAMPLING CIRCUIT AND DIGITAL/ANALOG CONVERTER

(75) Inventor: Yukio Koyanagi, Saitama (JP)

(73) Assignee: Yasue Sakai, Urawa (JP)

( * ) Notice: Subject to any disclaimer, the term of this patent is extended or adjusted under 35 U.S.C. 154(b) by 0 days.

(21) Appl. No.: 09/890,517
(22) PCT Filed: Dec. 15, 2000
(86) PCT No.: PCT/JP00/08902
§ 371 (c)(1), (2), (4) Date: Jul. 31, 2001
(87) PCT Pub. No.: WO01/45269
PCT Pub. Date: Jun. 21, 2001

(30) Foreign Application Priority Data

Dec. 17, 1999 (JP) ............................................. 11-360038

(51) Int. Cl.$^7$ ............................. H03M 1/66; H03M 1/36
(52) U.S. Cl. ......................... 341/144; 341/143; 341/159
(58) Field of Search ................................ 341/143, 144, 341/128, 129, 159

(56) References Cited

U.S. PATENT DOCUMENTS

| 4,167,731 A | 9/1979 | Eggermont ................... 341/76 |
| 4,862,170 A | * 8/1989 | Hashimoto et al. .......... 341/144 |
| 6,252,533 B1 | * 6/2001 | Tafuru et al. ................ 341/144 |
| 6,295,014 B1 | * 9/2001 | Eastty et al. ................. 341/143 |

FOREIGN PATENT DOCUMENTS

| JP | 4-61509 | 2/1992 | .......... H03M/12/02 |
| JP | 5-55875 | 3/1993 | .......... H03M/17/02 |
| WO | 99/38090 | 7/1999 | ........... G06F/17/17 |

* cited by examiner

Primary Examiner—Peguy JeanPierre
(74) Attorney, Agent, or Firm—Dellett and Walters

(57) ABSTRACT

It is object to provide an oversampling circuit and a digital-to-analog converter which have small circuit scales and component costs of which are reduced. The data input at predetermined intervals is multiplied by the multiplying section 1 by four types of multiplicators, and the multiplication results are cyclically held in data holding sections 2-1 through 2-4. The data selectors 3-1 through 3-4 sequentially read out the four types of multiplication results held in the data holding sections 2-1 through 2-4 one to one corresponding respectively to the data selectors 3-1 through 3-4 in a predetermined order, thereby outputting predetermined step functions. Each step function corresponding to each of the four pieces of data inputted sequentially is generated at a different timing, each of the integrating sections 4-1 through 4-4 performs a digitally integrating process two times on each step function, and the results are added up, thereby performing the oversampling process to give a pseudo-rise of a sampling frequency to each piece of input digital data.

10 Claims, 10 Drawing Sheets

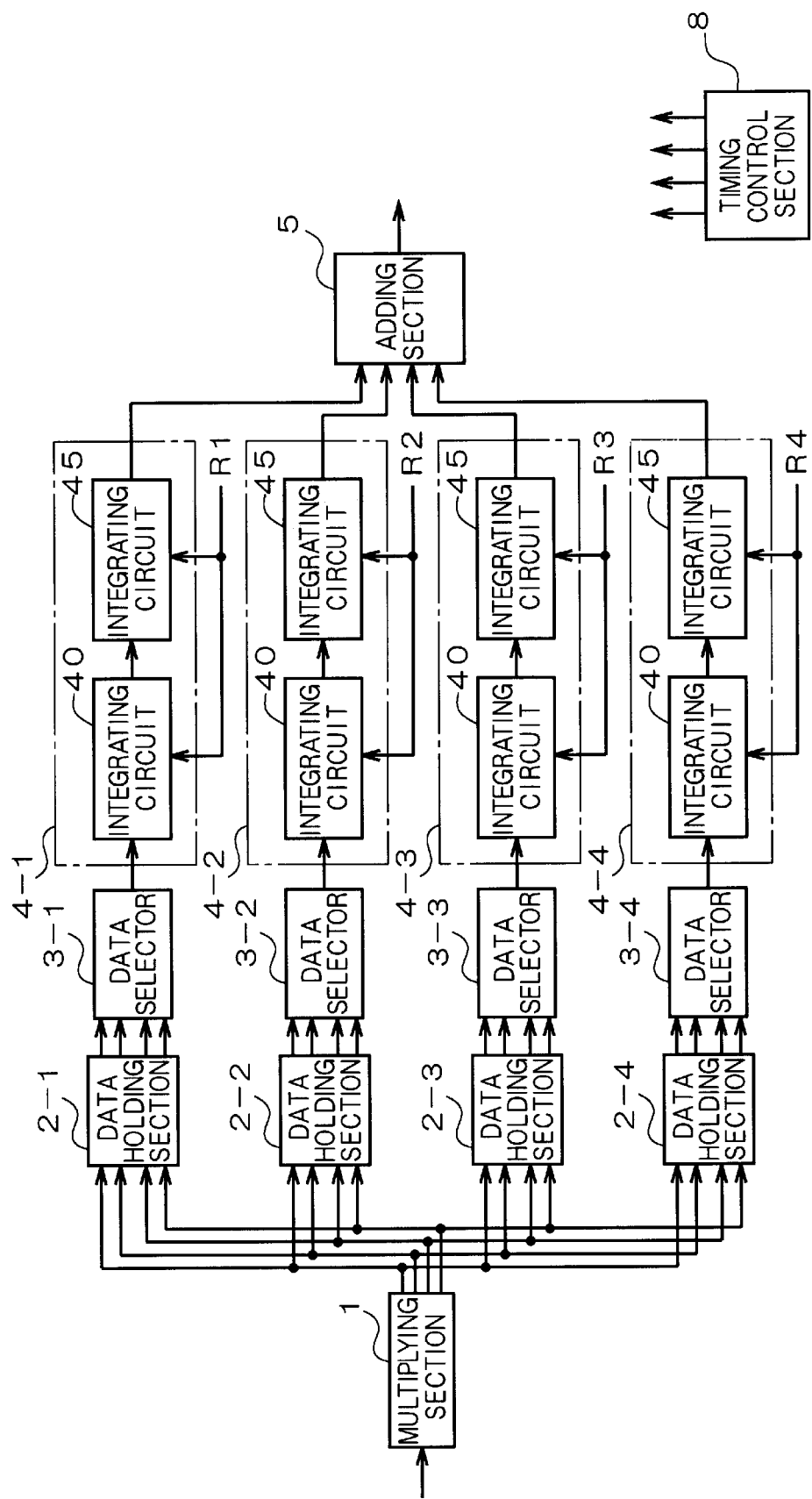

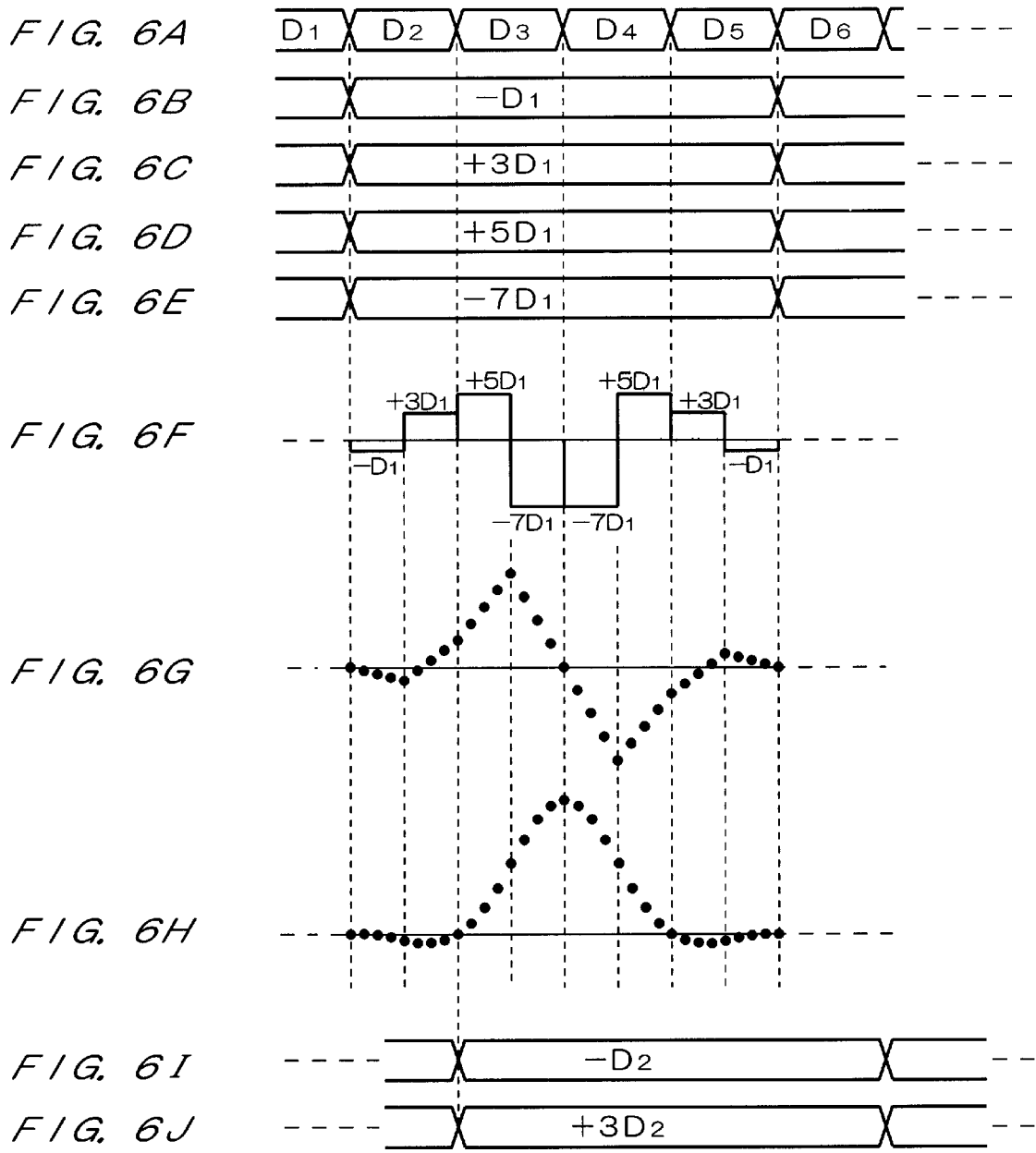

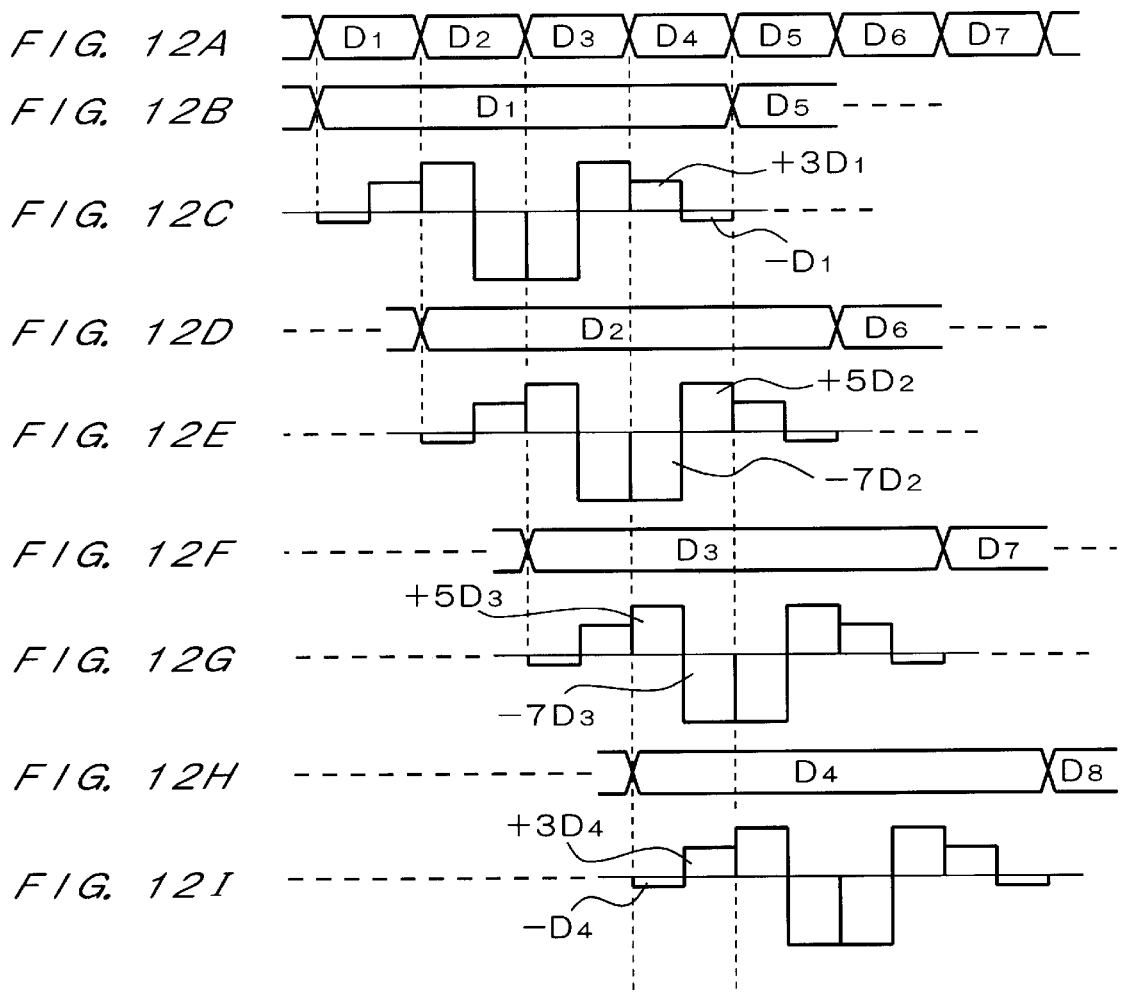

OVERSAMPLING CIRCUIT AND DIGITAL/ANALOG CONVERTER

TECHNICAL FIELD

The present invention relates to an over sampling circuit for interpolating input data discretely and a digital-to-analog converter to which the oversampling circuit is applied. In this specification, it is assumed that a case where function values have finite values except zero in a local region and become zero in regions different from the region is called a "local support."

BACKGROUND ART

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog audio signals by passing each interpolation value through a low-pass filter after generating a staircase signal waveform with each interpolation value held by the sample holding circuit.

A data interpolation system disclosed in WO99/38090 is well known as a method of interpolating data into discrete digital data. In this data interpolation system, differentiation can be performed only once in the whole range, and a sampling function is used such that two sampling points each before and after an interpolation point, that is, a total of four sampling points, can be considered. Since the sampling function has values of a local support unlike the sinc function defined by sin (πft)/(πft) where f indicates a sampling frequency, there is a merit that no truncation errors occur although only four pieces of digital data are used in the interpolating operation.

Generally, oversampling is performed by using a digital filter in which the waveform data of the above mentioned sampling function is set to a tap coefficient of an FIR (finite impulse response) filter.

If the oversampling technology of performing an interpolating operation for discrete digital data using the above mentioned digital filter, a low pass filter having a moderate attenuation characteristic can be used. Therefore, the phase characteristic with a low pass filter can approach a linear phase characteristic, and the sampling aliasing noise can be reduced. These effects are more outstanding with a higher oversampling frequency. However, if the sampling frequency becomes higher, the number of taps of the digital filter is also increased. As a result, there arises the problem of a larger circuit. In addition, the performance of the delay circuit or multiplier comprises the digital filter is also sped up. Therefore, it is necessary to use expensive parts appropriate for the quick performance, thereby increasing the cost of the required parts. Especially, when the oversampling process is performed using a digital filter, an actual value of a sampling function is used as a tap coefficient. Therefore, the configuration of a multiplier is complicated, and the cost of the parts furthermore increases.

Moreover, although a digital-to-analog converter can be configured by connecting a low pass filter after the over-sampling circuit, the above mentioned various problems with the conventional oversampling circuit have also occurred with the digital-to-analog converter configured using the circuit.

BRIEF SUMMARY OF THE INVENTION

The present invention has been achieved to solve the above mentioned problems, and aims at providing an over sampling circuit and a digital-to-analog converter having a smaller circuit at a lower cost of parts.

In an oversampling circuit according to the present invention, a plurality of step function generation unit generate a step function corresponding to each of plural pieces of digital data input at predetermined intervals in synchronization with the input timing of the digital data. After each of a plurality of integrating unit performs digital integration plural times on the data having the value of each step function, addition unit performs an adding operation. Thus, by adding up results of digital integration operations performed after generating a step function corresponding to each of input digital data, output data can be obtained with the values smoothly changing. When the frequency of oversampling is to be set high, it is necessary only to speed up the digital integration operation without the conventional complicated configuration, thereby simplifying the configuration and reducing the costs of parts. Especially, since reset unit resets the operation of the integrating unit at a predetermined timing, it prevents an error generated by an integrating operation, etc. from being accumulated.

Furthermore, each value of the above mentioned step functions is desired to correspond to each of the values of step functions obtained by differentiating plural times piecewise polynomials for a predetermined sampling function configured by the piecewise polynomials. That is, by integrating plural times the above mentioned step function, a waveform corresponding to the predetermined sampling function can be obtained. Therefore, a convolutional operation using a sampling function can be equivalently realized by generating a step function. As a result, the contents of the entire process can be simplified, and the amount of necessary processes for the oversampling process can be reduced.

In addition, the above mentioned step function is desired to equally set the positive and negative areas. Thus, the divergence of integration results of the integrating unit can be prevented.

Furthermore, it is desirable that the above mentioned sampling function has a value of local support with the whole range differentiable only once. It is assumed that a natural phenomenon can be approximated if the whole range is differentiable only once. By setting a smaller number of times of differentiation, the times of the digital integration performed by the integrating unit can be reduced, thereby successfully simplifying the configuration.

In addition, it is desirable that the resetting operation by the reset unit is performed at timing when the value of the sampling function is 0, and is more desirable that the operation is performed at timing when the value of a sampling function of local support converges into 0 while maintaining the differentiability. In the position where the value of the sampling function is 0, since the integration result by each integrating unit can also be 0 theoretically, the operation of each integrating unit can be reset at this timing without influence on the oversampling process, and with error prevented from being accumulated. Furthermore, at the timing (at both ends of sampling function) when a sampling function of local support converges into 0 while maintaining the differentiability, the values are theoretically 0 in all digital integration operations performed plural times. Therefore, each operation of the digital integration can be separately reset, thereby further preventing the accumulation of errors.

Additionally, it is further desirable that the above mentioned step function contains an area of eight sectional areas of equal width weighted by −1, +3, +5, −7, −7, +5, +3, and −1 in a predetermined range corresponding to five pieces of digital data arranged at equal intervals, and that every two of the eight weight coefficients correspond to the input intervals of the digital data. Since simple weight coefficients represented by integers can be used, the mechanism of generating a step function can be simplified.

In addition, it is desirable that the digital integration can be performed two times, and the data can be output from the integrating unit with the value changing like a quadric. To smoothly interpolating plural pieces of discrete data, it is necessary at least to change a value like a quadric. Since it can be realized only by setting the number of times of the digital integration to 2, the configuration of the integrating unit can be simplified.

Furthermore, the digital integration performed by the integrating unit is a process of accumulating input data, and it is desirable that the process is repeated n times in a period of inputting digital data. Thus, the operation of accumulating data can be realized only by adding input data to held data. Therefore, the configuration of the integrating unit can be simplified, and the process can be easily and more quickly repeated. As a result, the value of the multiple n of the oversampling can be set to a large value without complicating the configuration and largely increasing the cost of parts.

In addition, the digital-to-analog converter can be configured only by providing voltage generation unit and smoothing unit at the stage after the above mentioned oversampling circuit. Accordingly, the digital-to-analog converter according to the present invention can be realized with a simplified configuration and reduced cost of parts. Furthermore, the above mentioned oversampling circuit can easily set a high oversampling frequency without complicating the configuration or largely increasing the cost of parts. As a result, the distortion of the output waveform of the digital-to-analog converter to which the oversampling circuit is applied can be minimized.

BRIEF DESCRIPTION OF THE DRAWINGS

FIG. 5 is a diagram showing a the configuration of an oversampling circuit of an embodiment;

FIGS. 6A through 6J are charts showing the operation timings of generating a sampling function;

FIGS. 12A through 12I are charts showing the operation timings of generating a sampling function in the oversampling circuit of modified embodiment shown in FIG. 11.

BEST MODE FOR CARRYING OUT THE INVENTION

Figure 1:
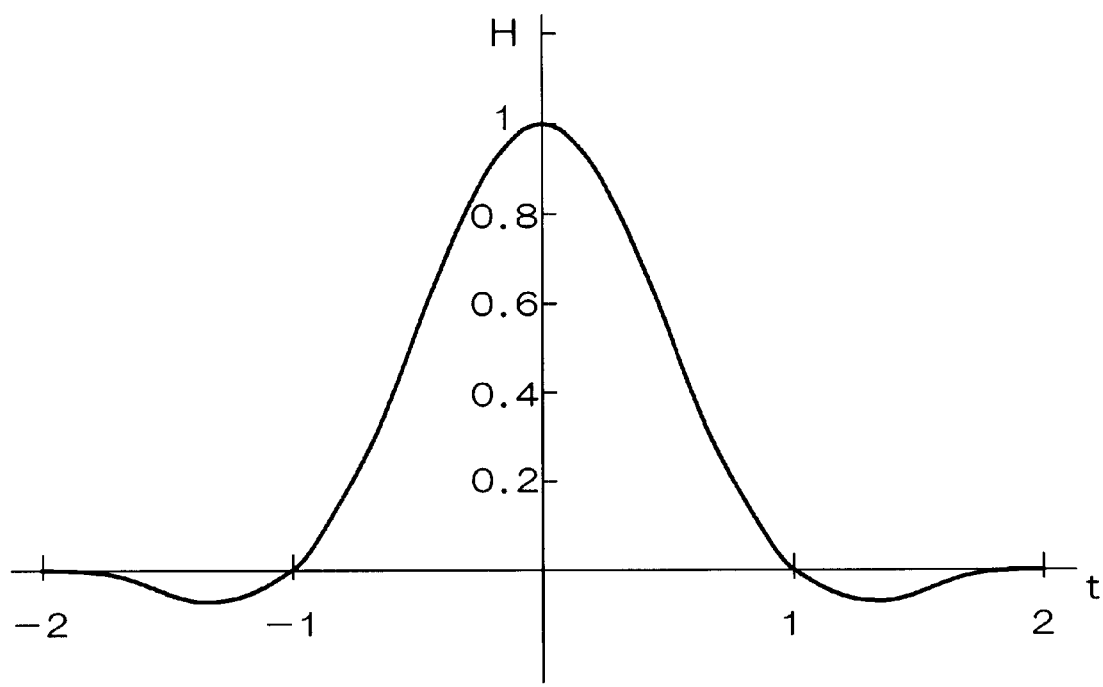
FIG. 1 is a diagram showing a sampling function used in an interpolating operation in the oversampling circuit according to an embodiment.

The oversampling circuit according to an embodiment of the present invention will be described below in detail by referring to the drawings. FIG. 1 shows a sampling function used in the interpolating operation by the oversampling circuit according to the present embodiment. The sampling function H(t) is disclosed by WO99/38090, and represented by the following expressions.

| | |
|---|---|
| $(-t^2-4t-4)/4$ | $;-2 \leq t < -3/2$ |
| $(3t^2+8t+5)/4$ | $;-3/2 \leq t < -1$ |
| $(5t^2+12t+7)/4$ | $;-1 \leq t < -1/2$ |
| $(-7t^2+4)/4$ | $;-1/2 \leq t < 0$ |
| $(-7t^2+4)/4$ | $;0 \leq t < 1/2$ |
| $(5t^2-12t+7)/4$ | $;1/2 \leq t < 1$ |
| $(3t^2-8t+5)/4$ | $;1 \leq t < 3/2$ |
| $(-t^2+4t-4)/4$ | $;3/2 \leq t \leq 2 \ldots$ (1) | where t=0, ±1, ±2 indicates the sampling position. The sampling function H(t) shown in FIG. 1 can be differentiated only once in the whole range, and is a function of local support converging into 0 with the sampling position t=±2. By performing an overlapping process using the sampling function H(t) based on each sampling value, the interpolating process can be performed using a function differentiable only once in the sampling values.

Figure 2:
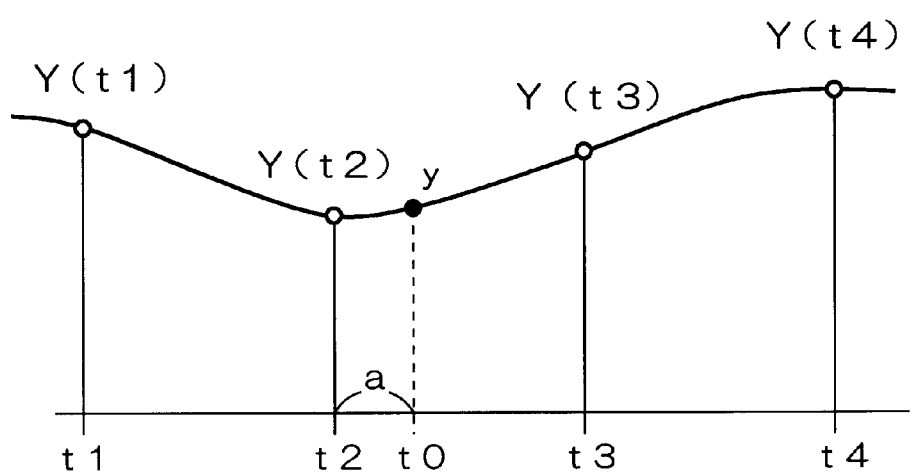
FIG. 2 is a diagram showing a relationship between the sampling values with an interpolation values.

FIG. 2 shows the relationship between the sampling values and the interpolation values. As shown in FIG. 2, assume that four sampling positions are t1, t2, t3, and t4, and the distance between two adjacent sampling positions is 1. The interpolation value y corresponding to the interpolation position t0 between the sampling positions t2 and t3 is obtained by the following equation.

$$y=Y(t1)\cdot H(1+a)+Y(t2)\cdot H(a)+Y(t3)\cdot H(1-a)+Y(t4)\cdot H(2-a) \quad (2)$$

where Y(t) indicates each sampling value at the sampling position t. Each of 1+a, a, 1−a, and 2−a indicates the distance between the interpolation position t0 and each of the sampling positions t1 through t4.

As described above, by performing a convolution operation by computing the value of the sampling function H(t) corresponding to each sampling value, an interpolation value of sampling values can be obtained theoretically. However, the sampling function shown in FIG. 1 is a quadric piecewise polynomial differentiable only once in the whole range. Using this feature, the interpolation value can be obtained in another equivalent process procedure.

Figure 3:
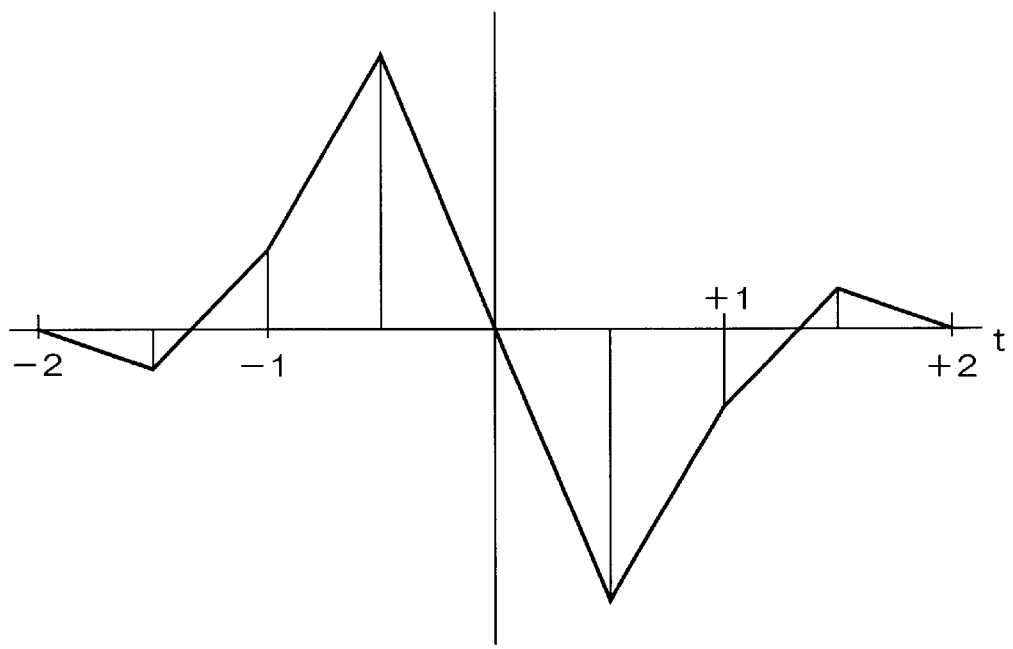
FIG. 3 is a diagram showing a waveform obtained by differentiating once the sampling function shown in FIG. 1.

FIG. 3 shows a waveform obtained by differentiating once the sampling function shown in FIG. 1. The sampling function H(t) shown in FIG. 1 is a quadric piecewise polynomial differentiable once in the entire range. Therefore, by performing the differentiation once, a polygonal line function formed by the waveform of a continuous polygonal line as shown in FIG. 3 can be obtained.

Figure 4:
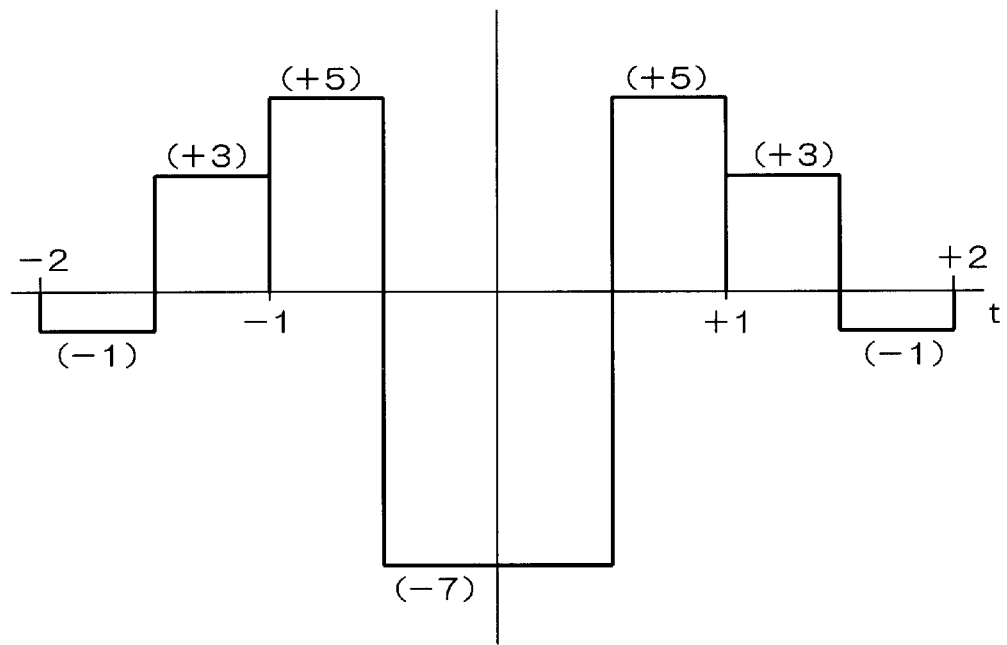
FIG. 4 is a diagram showing a the waveform obtained by further differentiating the polygonal line function shown in FIG. 3.

FIG. 4 shows the waveform obtained by further differentiating the polygonal line function shown in FIG. 3. However, the polygonal line waveform contains a plurality of corner points, and the differentiation cannot be performed in the whole range. Therefore, the differentiation is performed on the linear portion between two adjacent corner points. By differentiating the polygonal line waveform shown in FIG. 3, the step function formed by the stepwise waveform as shown in FIG. 4 can be obtained.

Thus, the above mentioned sampling function H(t) is once differentiated in the entire range to obtain a polygonal line function. By further differentiating each of the linear portions of the polygonal line function, a step function can be obtained. Therefore, in the reverse order, by generating the step function shown in FIG. 4, and integrating it twice, the sampling function H(t) shown in FIG. 1 can be obtained.

In the step function shown in FIG. 4, the positive and negative areas are set equal to each other, and the sum of the areas equals 0. That is, by integrating such a step function plural times, a sampling function of local support, as shown in FIG. 1, whose differentiability in the whole range is guaranteed can be obtained.

In computing the interpolation value in the convolutional operation shown by the equation (2), the value of the sampling function H(t) is multiplied by each sampling value. If the sampling function H(t) is obtained by integrating twice the step function shown in FIG. 4, the value of the sampling function obtained in the integrating process is multiplied by each sampling value, or equivalently, when a step function before the integration processing is generated, an interpolation value can be obtained by generating a step function by multiplication by each sampling value, and performing twice the integrating process on the result obtained in the convolution operation using the step function. The oversampling circuit according to the present embodiment obtains an interpolation value as described above. This process is described below in detail.

FIG. 5 shows the configuration of the oversampling circuit according to the present embodiment. The oversampling circuit shown in FIG. 5 performs an oversampling process on the discrete data input at predetermined intervals, and comprises a multiplying section 1, f our data holding sections 2-1, 2-2, 2-3, and 2-4, four data selectors 3-1, 3-2, 3-3 and 3-4, four integrating sections 4-1, 4-2, 4-3, and 4-4, an adding section 5, and a timing control section 8.

The multiplying section i outputs a result of multiplying discrete data sequentially input at predetermined intervals by a multiplicator corresponding to each value of the step function shown in FIG. 4. Each value of the step functions shown in FIG. 4 can be obtained by twice differentiating each piecewise polynomial of the above mentioned equation (1) as follows.

| | |
|---|---|
| −1 | ; −2≦t<−3/2 |
| +3 | ; −3/2≦t<−1 |
| +5 | ; −1≦t<−1/2 |
| −7 | ; −1/2≦t<0 |
| −7 | ; 0≦t<1/2 |
| +5 | ; 1/2≦t<1 |
| +3 | ; 1≦t<3/2 |
| −1 | ; 3/2≦t≦2 |

Therefore, the multiplying section 1 multiplies the input data D by the multiplicators corresponding to the above mentioned step functions, that is, −1, +3, +5, and −7, when the data D is input, and concurrently outputs a set of four-piece data, that is, −D, +3D, +5D, and −7D.

Each of the data holding sections 2-1 through 2-4 cyclically fetches the one set of four-piece data output from the multiplying section 1, and holds the data until the next fetching timing. For example, the one set of four-piece data first output from the multiplying section 1 is held in the data holding section 2-1, and the second output set of four-piece data is held in the data holding section 2-2. Furthermore, the third output set of four-piece data is held in the data holding section 2-3, and the fourth output set of four-piece data is held in the data holding section 2-4. When a cycle of the data holding operation is completed in the data holding sections 2-1 through 2-4, then the fifth output data from the multiplying section 1 is fetched and held by the data holding section 2-1 which has first held the data. Thus, sets of four-piece data sequentially output from the multiplying section 1 are cyclically held by the data holding sections 2-1 through 2-4.

Each of the data selectors 3-1 through 3-4 outputs data whose values change stepwise corresponding to a step function by sequentially reading four pieces of data held in the one-to-one corresponding data holding sections 2-1 through 2-4 in a predetermined order. Practically, for example, when four pieces of data (−D, +3D, +5D, and −7D) obtained by multiplying the data D by the above mentioned four types of multiplicators are held in the data holding section 2-1, the data selector 3-1 cyclically reads the held digital data in the order of −D, +3, +5D, −7D, −7D, +5D, +3D, and −D at predetermined time intervals, thereby outputting the data of step functions having a value proportional to the input data D.

Each of the integrating sections 4-1 through 4-4 twice performs a digital integration process on the data output from each of the one-to-one corresponding data selectors 3-1 through 3-4, and comprising an integrating circuit 40 and an integrating circuit 45. From each of the integrating sections 4-1 through 4-4, the data corresponding to the sampling function having a value proportional to the input data is output.

There can be an error caused by, for example, noise, etc. in the data input into the integrating sections 4-1 through 4-4. If each of the integrating sections 4-1 through 4-4 repeats the integrating process on the sequentially input data, then the error is accumulated, and the operation result is diverged. Therefore, it is desirable that the influence of the error can be removed. The integrating sections 4-l through 4-4 according to the present embodiment respectively receive reset signals R1 through R4 to avoid the divergence of the operation results when the integrating process is performed. Described below are the reset signals R1 through R4.

As shown in FIG. 1, the sampling function according to the present embodiment is function of local support converging into 0 in the sampling position ±2. The polygonal line function shown in FIG. 3 obtained once the sampling function is differentiated also converges into 0 in the sampling position ±2. Therefore, the polygonal line function obtained by once performing an integrating process on a step function after generating the step function having the value proportional to the input data, and the sampling function obtained by further performing an integrating process on the polygonal line function also have to converge into 0 in the sampling position ±2 theoretically. However, in the actual digital integrating circuit, if error due to noise, etc. as described above is contained in data, the operation results of the polygonal line function and the sampling function do not converge into 0 in the sampling position ±2, thereby diverging the operation results when the operation error accumulates by repeating the integrating processes. Therefore, according to the present embodiment, the influence of error is removed to prevent the divergence of the operation results by resetting the operation results when the integrating process is performed at intervals corresponding to the sampling period ±2 in each digital integrating circuit.

The adding section 5 outputs interpolated data by sequentially adding the data output from the four integrating sections 4-1 through 4-4. The timing control section 8 generates various signals for control of the operation timing of the entire oversampling circuit according to the present embodiment, for example, the reset signals R1 through R4 input into the respective integrating sections 4-1 through 4-4. The various signals generated by the timing control section 8 are described later in detail.

The above mentioned multiplying section 1, the data holding section 2-1, and the data selector 3-1 correspond to the first step function generation unit; the multiplying section 1; the data holding section 2-2, and the data selector 3-2 correspond to the second step function generation unit; the multiplying section 1, the data holding section 2-3, and the data selector 3-3 correspond to the third step function generation unit; and multiplying section 1, the data holding section 2-4, and the data selector 3-4 correspond to the fourth step function generation unit. In addition, the integrating sections 4-1 through 4-4 correspond to a plurality of integrating unit; the adding section 5 corresponds to the addition unit; and the timing control section 8 for generating the reset signals R1 through R4 corresponds to the reset unit.

Since the data corresponding to the step function output from the above mentioned data selector 3-1 has a value proportional to the value of the data input to the multiplying section 1 at predetermined intervals, the data corresponding to the sampling function having a value proportional to the input data is output from the integrating section 4-1 by performing twice the integrating process on the step function by the integrating section 4-1. Furthermore, adding by the adding section 5 the data output from the integrating sections 4-1 through 4-4 equals obtaining an interpolation value by performing a convolution operation corresponding to the data input at predetermined intervals using the sampling function shown in FIG. 1.

Therefore, in the case of inputting data into the oversampling circuit according to the present embodiment at predetermined time intervals, the data holding timing of each data holding section is shifted corresponding to the input interval, and timing of starting generating a step function by each of the data selectors 3-1 through 3-4 is shifted, and the results of twice performing the digital integration process are added to each of the generated step functions, thereby obtaining plural pieces of interpolated data whose values change stepwise along the curve smoothly connecting data input at predetermined intervals.

Furthermore, the step function output from each of the data selectors 3-1 through 3-4 is a function of local support having eight sectional areas obtained by dividing an area in the sampling position t=−2~+2 in the finite range of the sampling function shown in FIG. 1 into eight 0.5 sections. When a sampling function having the value corresponding to the input data is obtained by twice performing the integrating process, the integrating sections 4-1 through 4-4 perform a digital integration process by further performing the accumulating operation n times on each of the above mentioned eight sectional areas. That is, the digital integration process is performed at 2n times as high as the frequency on the sampling frequency of the input data. Thus, (2n −1) pieces of interpolated data are obtained among the input data by the adding section 5 adding up the digital data corresponding to the sampling function output from each of the integrating sections 4-1 through 4-4. This operation refers to 2n times performing the oversampling process.

FIGS. 6A through 6J show the operation timing of generating a sampling function in the oversampling circuit according to the present embodiment. As shown in FIG. 6A, when data $D_1$, $D_2$, $D_3$, . . . are input at predetermined time intervals, the multiplying section 1 concurrently performs the processes of multiplying the input data by four multiplicators corresponding to the above mentioned step functions. The four pieces of data multiplied by a predetermined multiplicator by the multiplying section 1 are cyclically held in the data holding sections 2-1 through 2-4 in a set of four-piece data. Practically, the data holding section 2-1 fetches a set of data ($-D_1$, $+3D_1$, $+5D_1$, $-7D_1$) first output from the multiplying section 1, and holds the data until the next data fetching timing (FIGS. 6B through 6E). Then, the data selector 3-1 sequentially reads the held data from the data holding section 2-1 in the order of $-D_1$, $+3D_1$, $+5D_1$, $-7D_1$, $-7D_1$, $+5D_1$, $+3D_1$, and $-D_1$ as described above. The held data is read at the ½ interval of the input intervals of the input data $D_1$, $D_2$, $D_3$, . . . Therefore, the data selector 3-1 outputs the data corresponding to the step function having the value proportional to the input data $D_1$ (FIG. 6F).

The two integrating circuits 40 and 45 in the integrating section 4-1 perform the digital integration process two times on the data (data corresponding to the step function) output from the data selector 3-1. Therefore, the integrating circuit 40 at the preceding stage outputs the data corresponding to the polygonal line function proportional to the value of the input data $D_1$ (FIG. 6G). The integrating circuit 45 at the subsequent stage outputs the data corresponding to the sampling function proportional to the value of the input data $D_1$ (FIG. 6H).

The data processes shown in FIGS. 6B through 6H are performed by the data holding sections 2-2 through 2-4, the data selectors 3-2 through 3-4, and the integrating sections 4-2 through 4-4 (FIGS. 6I, 6J, . . . ), and each of the integrating sections 4-1 through 4-4 outputs the data corresponding to the sampling function having a value corresponding to the input data $D_1$, $D_2$, $D_3$, . . .

Figure 7A:
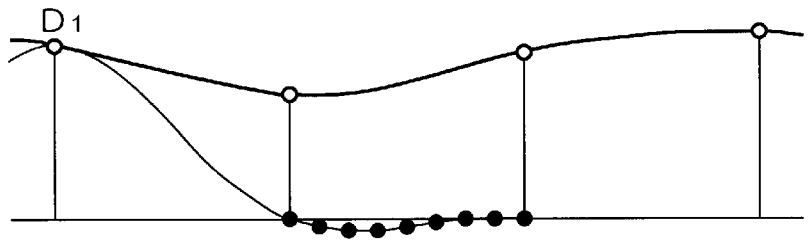
FIGS. 7A through 7E are charts showing the operation timings of the convolution operation.
Figure 7B:
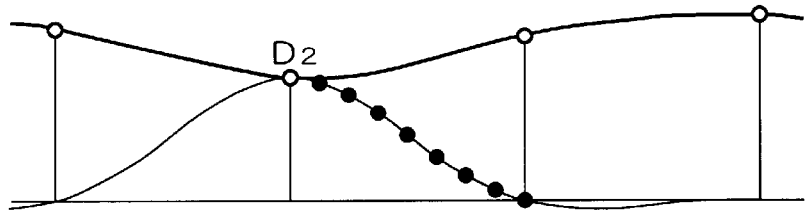
Figure 7C:
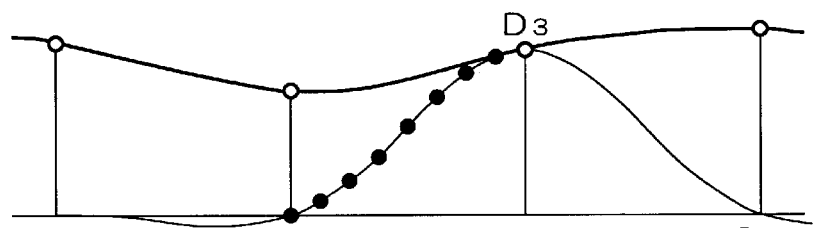
Figure 7D:
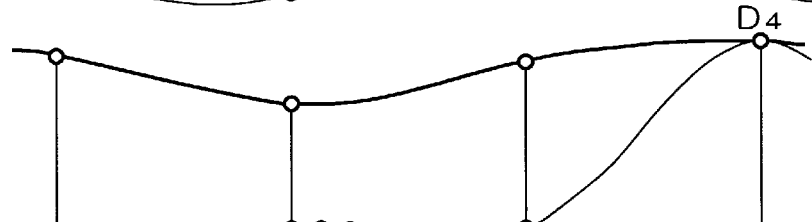
Figure 7E:
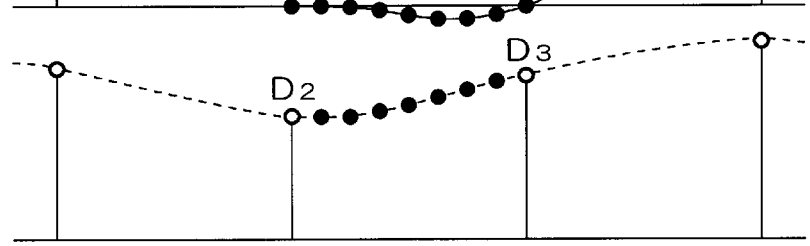

FIGS. 7A through 7E show operation timings of the convolution operation performed by the oversampling circuit according to the present embodiment. FIG. 7A shows the data corresponding to the sampling function output from the integrating section 4-1. FIG. 7B shows the data corresponding to the sampling function output from the integrating section 4-2. FIG. 7C shows the data corresponding to the sampling function output from the integrating section 4-3. FIG. 7D shows the data corresponding to the sampling function output from the integrating section 4-4. The sampling functions shown in FIGS. 7A, 7B, 7C, and 7D respectively correspond to the input data $D_1$, $D_2$, $D_3$, and $D_4$. FIG. 7E shows the interpolated data obtained by sequentially adding the data output from each of the integrating sections 4-1 through 4-4.

Thus, the oversampling circuit according to the present embodiment multiplies the data input into the multiplying section at predetermined intervals by the four types of multiplicators, cyclically holds the multiplication results in the data holding sections 2-1 through 2-4, sequentially reads in a predetermined order the four types of multiplication results held in the data holding sections 2-1 through 2-4, and generates a step function. Then, it generates each step function corresponding to each of the four types of the sequentially input data at a different timing, and adds up the multiplication results after twice performing the digital integration process by each of the integrating sections 4-1 through 4-4 on each of the step functions, thereby performing the oversampling process for pseudo-increase of the sampling frequency. Therefore, it is necessary only to speed up the operation when the digital integration process is performed in case where the oversampling frequency is set higher, thereby simplifying the configuration and reducing the cost of parts without the conventional complicated configuration.

Especially when operations are performed by each of the integrating sections on the data corresponding to the polygonal line function and the sampling function having the value proportional to the input data, the operation result of the digital integration process can be forcibly reset in the sampling position ±2 by making the most of the feature of the sampling function converging into 0 in the sampling position ±2, thereby successfully preventing the divergence of the operation result of each integrating section.

Figure 8:
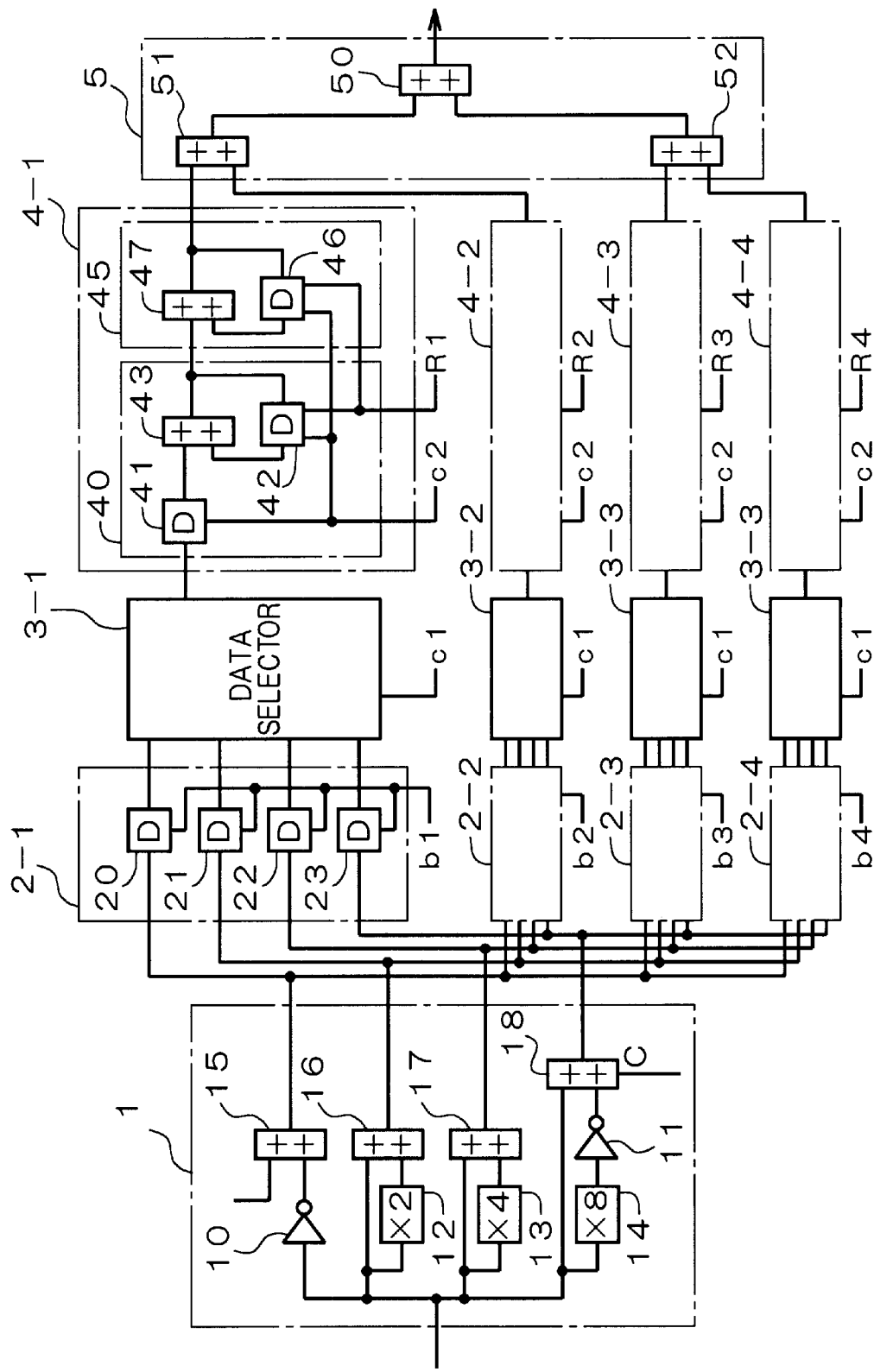
FIG. 8 is a diagram showing a detailed configuration of the oversampling circuit shown in FIG. 5.
Figure 9:
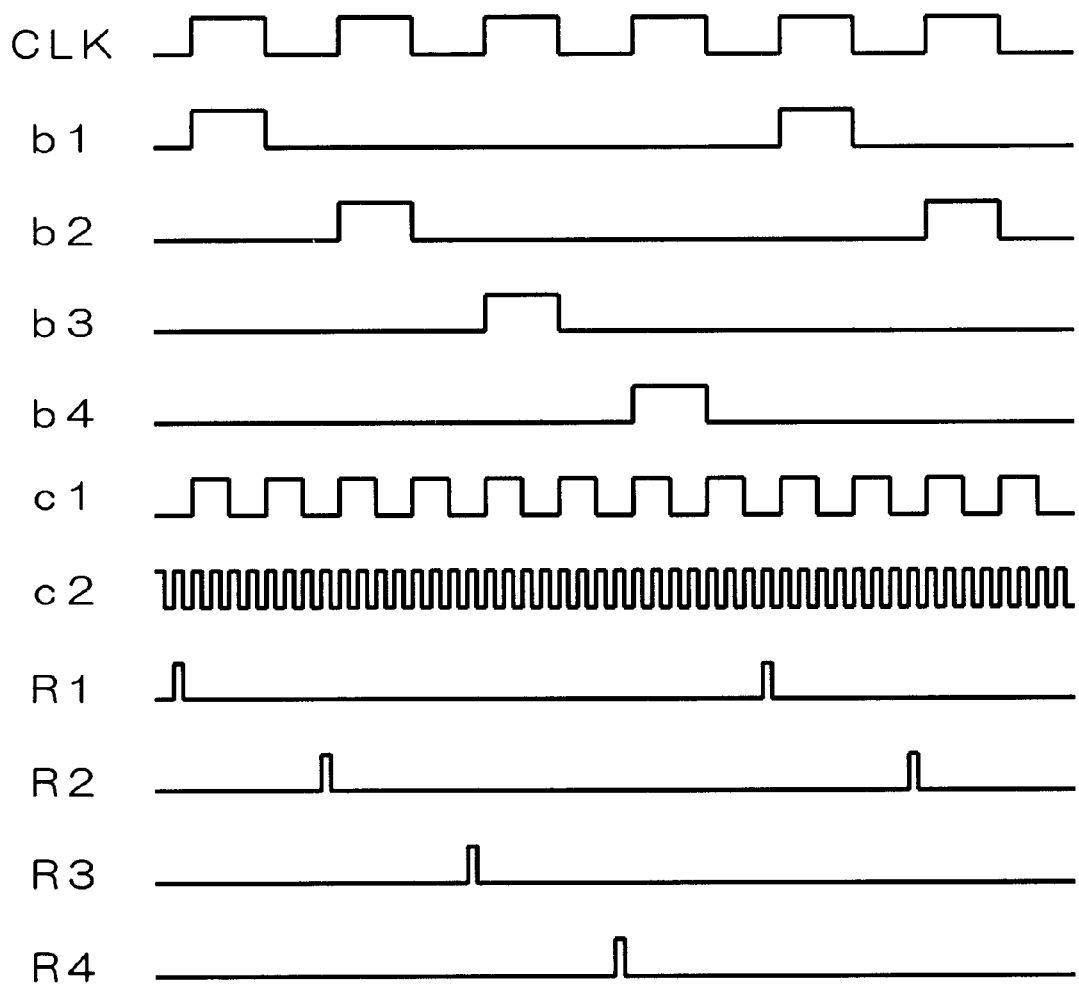
FIG. 9 is a timing chart showing various signals output from timing control section.

FIG. 8 shows the detailed configuration of the oversampling circuit shown in FIG. 5. FIG. 9 is a timing chart of various signals output from the timing control section 8.

As shown in FIG. 8, the multiplying section 1 comprises two inverters 10 and 11 for inverting the logic of each bit of the input data and outputting the result, a multiplier 12 for multiplying by the multiplicator of 2, a multiplier 13 for multiplying by the multiplicator of 4, a multiplier 14 for multiplying by the multiplicator of 8, and four adders 15, 16, 17, and 18. The clock signal CLK shown in FIG. 9 is a clock signal having the same frequency as the sampling frequency of the input data, and data $D_1$, $D_2$, . . . are input into the multiplying section 1 in synchronization with the clock signal CLK at a predetermined interval.

For example, when data $D_1$ is input, the inverter 10 outputs the data obtained by inverting the logic of each bit of the input data $D_1$, the adder 15 adds 1 to the lowest bit of each piece of the output data, thereby obtaining the complement of the input data $D_1$. This equivalently shows the value $(-D_1)$ obtained by multiplying the in put data $D_1$ by $-1$. Furthermore, the multiplier 12 outputs a value $(+2D_1)$ two times as large as the value of the input data $D_1$, and the adder 16 adds the original input data $D_1$ to the data, thereby obtaining the value $(+3D_1)$ three times as large as the input data $D_1$. Similarly, the multiplier 13 outputs a value $(+4D_1)$ four times as large as the input data $D_1$, and the adder 17 adds the value to the original input data $D_1$, thereby obtaining a value $(+5D_1)$ five times as large as the input data $D_1$. Additionally, the multiplier 14 outputs a value $(+8D_1)$ eight times as large as the input data $D_1$, the inverter 11 inverts the logic of each bit of the output data, and the adder 18 adds the original input data $D_1$ to the inverted data. The adder 18 has a valid carry terminal C, and adds 1 to the lowest bit of the output data of the inverter 11, thereby obtaining the complement of the output data of the inverter 11. Therefore, a value $-7$ times as large as the input data $D_1$ can be obtained by the adder 18 adding the original input data $D_1$ to the value $-8$ times as large as the input data $D_1$.

Since the multiplicators are power of 2, the above mentioned three multipliers 12, 13, and 14 can perform the multiplying process only by performing bit shifting operation. Thus, by combining the multiplying process of the power of 2 by the bit shift with the adding process, the multiplying process is performed by four multiplicators, thereby simplifying the configuration.

The data holding sections 2-1 through 2-4 are configured respectively by four D flip-flops 20 through 23. The timing signals b1 through b4 shown in FIG. 9 show the data holding timings of the data holding sections 2-1 through 2-4 respectively. The timing signals b1, b2, b3, and b4 are respectively input into the data holding sections 2-1, 2-2, 2-3, and 2-4. For example, the data holding operations of the four D flip-flops 20, 21, 22, 23 contained in the data holding section 2-1 are performed in synchronization with the rise time of the timing signal b1. In the data output from the multiplying section 1 corresponding to the first input data $D_1$, the data $(-D_1)$ output from the adder 15, the data $(+3D_1)$ output from the adder 16, the data $(+5D_1)$ output from the adder 17, and the data $(-7D_1)$ output from the adder 18 are simultaneously fetched to the D flip-flops 20, 21, 22, and 23 respectively, and held therein until the next data fetching timing.

The clock signal cl shown in FIG. 9 shows the reading timing when the data selectors 3-1 through 3-4 read the data held in the corresponding data holding sections 2-1 through 2-4. For example, the data selector 3-1 sequentially selects the D flip-flops 20 through 23 in a predetermined order in synchronization with the clock signal c1, and reads the data held therein, and outputs the data corresponding to the step function $(-D_1, +3D_1, +5D_1, -7D_1, -7D_1, +5D_1, +3D_1, -D_1)$.

The integrating circuit 40 at the preceding stage contained in each of integrating sections 4-1 through 4-4 comprises the two D flip-flops 41 and 42, and an adder 43. The integrating circuit 45 at the subsequent stage comprises a D flip-flop 46 and an adder 47. These integrating circuits 40 and 45 perform a digital integrating operation by sequentially adding and accumulating input data. The clock signal c2 shown in FIG. 9 is a clock signal input to the D flip-flops 41, 42, and 46, and the repetition cycle of the accumulating operation by the two integrating circuits 40 and 45 can be set using the clock signal c2. For example, the frequency of the clock signal c2 is set to a value eight times as high as that of the above mentioned clock signal CLK. Therefore, each of the integrating circuits 40 and 45 performs the accumulating operation by fetching new data in synchronization with the clock signal c2. Furthermore, the time interval for the accumulating operation can be arbitrarily set by changing the frequency of the clock signal c2, thereby changing the magnification n of the oversampling.

The reference numerals R1 through R4 shown in FIG. 9 denote reset signals respectively input into the integrating sections 4-1 through 4-4. For example, the reset signal R1 is input into the integrating circuits 40 and 45 of the integrating section 4-1 at the timing corresponding to the sampling position t=±2 of polygonal line function shown in FIG. 3 and the sampling function shown in FIG. 1, and the contents held in the three D flip-flops 41, 42, and 46 are reset. Since the value of the polygonal line function shown in FIG. 3 is always 0 in the sampling position t=0, a reset signal can be input into the integrating circuit 40 at the preceding stage at this timing. Similarly, since the value of the sampling function shown in FIG. 1 is always 0 in the sampling position t=±1, a reset signal can be input into the integrating circuit 45 at the subsequent stage at this timing.

Similar operations are performed with other reset signals R2 through R4. That is, these signals are respectively input into the integrating sections 4-2 through 4-4 at the timing when the value is 0 in each of the integrating circuits 40 and 45.

The adding section 5 shown in FIG. 8 comprises three adders 50, 51, and 52 having two input terminals. These three adders 50, 51, and 52 add up the four pieces of data concurrently output from the integrating sections 4-1 through 4-4, and interpolated data is output.

Thus, the oversampling circuit according to the present embodiment sets how many times the sampling frequency of the input data the oversampling frequency is to be set depends only on the frequency of the clock signal c2 input into the two integrating circuits 40 and 45. That is, the multiple of the oversampling can be set large only by configuring the two integrating circuits 40 and 45 using high-speed parts. Therefore, unlike the conventional method of performing the oversampling process using a digital filter, the entire circuit is not large although the frequency of the oversampling is set higher, thereby minimizing the increase of the cost of parts. Furthermore, the contents of the operations can be simplified by using the four integer multiplicators in the multiplying process by the multiplying section 1, thereby simplifying the configuration of the multiplying section, and reducing the cost of parts.

Furthermore, for example, when an oversampling process is performed to obtain a pseudo frequency n times as high as the sampling frequency (for examples, 1024 times), it has been necessary in the conventional method to have the operation speed of the parts as high as the pseudo frequency. However, according to the oversampling circuit of the present embodiment, except the two integrating circuits, it is necessary to operate the multiplying section 1, each data holding section, each data selector, etc. at the sampling frequency or the frequency twice as high as the sampling frequency, thereby considerably reducing the operation speed of each part.

Figure 10:
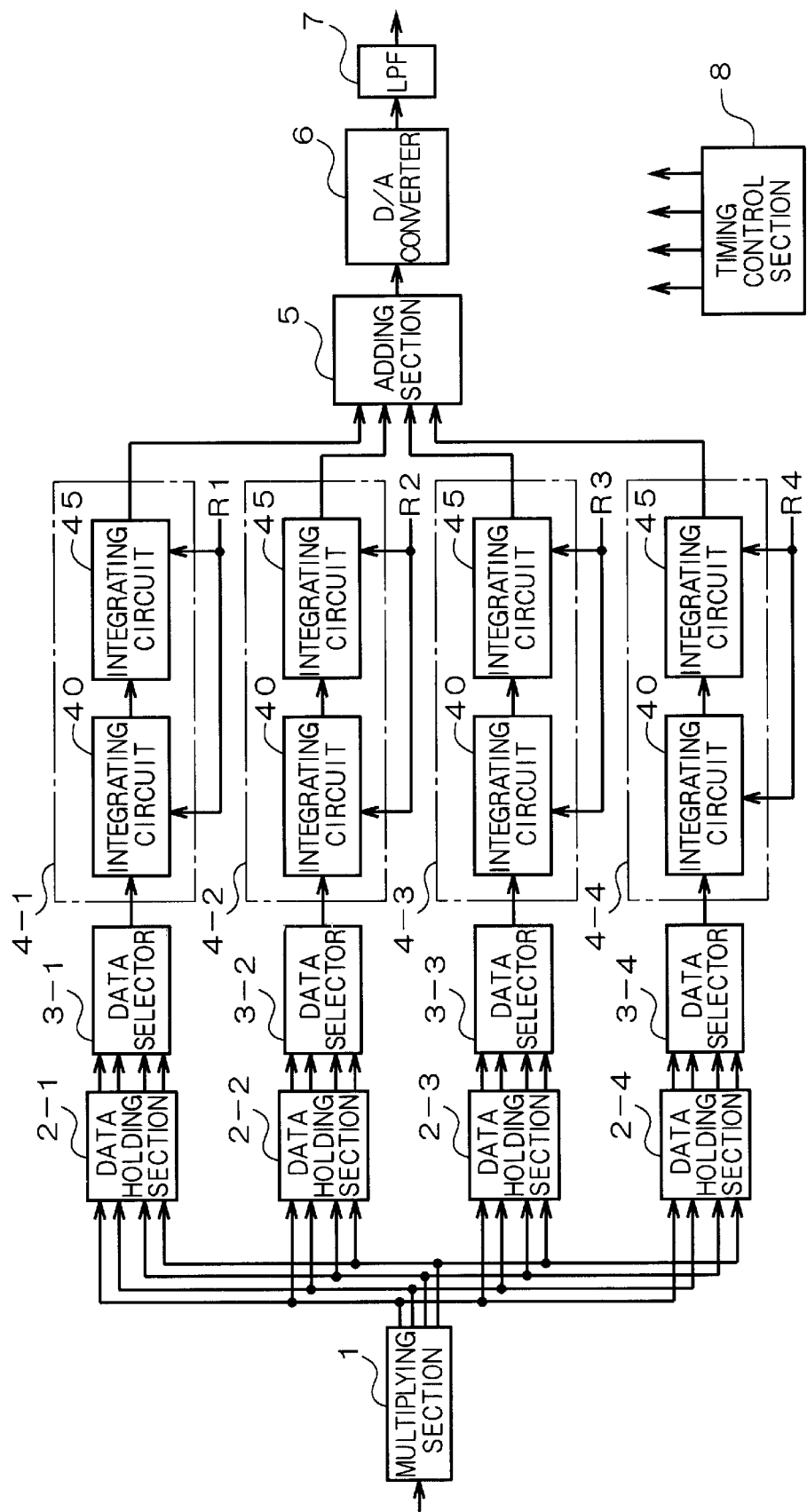
FIG. 10 is a diagram showing a configuration of the D/A converter to which the oversampling circuit shown in FIG. 5 is applied.

A D/A converter can be configured with smaller number of parts by adding a low pass filter, etc. at the subsequent stage of the above mentioned oversampling circuit. FIG. 10 shows the configuration of the D/A converter. The D/A converter has the configuration obtained by adding a D/A converter 6 and a low pass filter (LPF) 7 at the subsequent stage of the oversampling circuit shown in FIG. 5. The D/A converter 6 corresponds to the voltage generation unit, and the lowpass filter 7 corresponds to the smoothing unit.

The D/A converter 6 generates an analog voltage corresponding to the stepwise digital data output by the adding section 5. The D/A converter 6 generates a constant analog voltage proportional to the value of the input digital data, and the voltage value at the output terminal of the D/A converter 6 also changes stepwise. The low pass filter 7 smoothes the output voltage of the D/A converter 6, and outputs a smoothly changing analog signal.

Since the D/A converter shown in FIG. 10 uses the oversampling circuit shown in FIG. 5, the configuration can be simplified and the cost of parts can be reduced. Although an output waveform is obtained with less distortion and the oversampling frequency set high, the configuration is not complicated with reduced cost. Furthermore, the problem that an output voltage is gradually increased or decreased because of accumulation of error can be avoided.

The present invention is not limited to the above mentioned embodiments, but variations can be realized within the scope of the gist of the present invention. For example, in the above mentioned embodiment, a function of local support which can be differentiated only once in the entire range is used as a sampling function, but the differentiation can be performed two or more times. In addition, as shown in FIG. 1, the sampling function according to the present embodiment is converged into 0 at $t=\pm 2$, but it also can be converged into 0 at $t=\pm 3$, or beyond. For example, in a case of the sampling function converging to zero at $t=\pm 3$, the numbers of the data holding sections, the data selectors, and the integrating sections shown in FIG. 5 may be set six, respectively, and interpolating operation may be performed for the six digital data.

Furthermore, it is not limited to the interpolating process using a sampling function of local support, but using a sampling function differentiable finite times having a predetermined value in the range from $-\infty$ to $+\infty$, an interpolation process may be performed only for plural digital data corresponding to finite sample position. For example, assuming that the sampling function is defined by a quadric piecewise polynomial, a predetermined step function waveform can be obtained by twice differentiating each piecewise polynomial. Therefore, when an interpolation value is obtained using the step function, the output value is reset at the timing when the value of the sampling function is constantly 0 or the value of the polygonal line function is constantly 0, thereby preventing the divergence of the operation result by the accumulation of error.

In the above mentioned embodiment, the discrete data sequentially input at predetermined intervals is multiplied by a multiplicator corresponding to each value of the above mentioned step function shown in FIG. 4 by the multiplying section 1. The resultant set of four-piece data is cyclically fetched and held by the data holding sections 2-1 through 2-4, and the data held by the data holding sections 2-1 through 2-4 is read in a predetermined order by the data selectors 3-1 through 3-4. Thus, a step function is generated. However, the method of generating a step function is not limited to the above mentioned method, but various other methods can be used.

Figure 11:
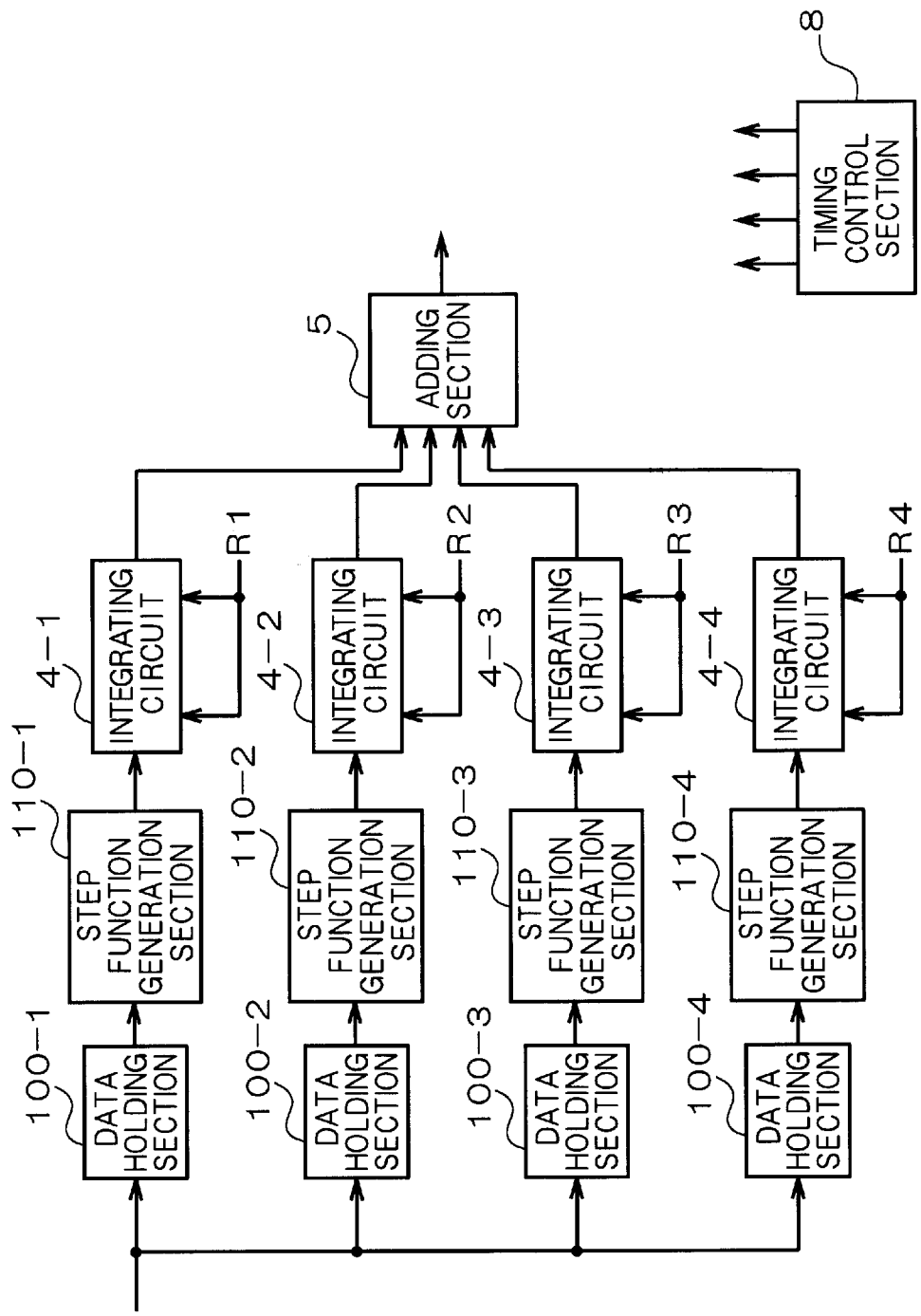
FIG. 11 is a diagram showing a configuration of the oversampling circuit in other methods of generating a step function.

FIG. 11 shows the configuration of the oversampling circuit in other methods of generating a step function. The oversampling circuit shown in FIG. 11 comprises four data holding sections 100-1, 100-2, 100-3, and 100-4, four step function generation sections 110-1, 110-2, 110-3, and 110-4, four integrating sections 4-1, 4-2, 4-3, and 4-4, the adding section 5, and the timing control section 8. Among them, the integrating sections 4-1 through 4-4, the adding section 5, and the timing control section 8 perform basically the similar operations as shown in FIG. 5. Therefore, the detailed explanation is omitted here.

Each of the data holding sections 100-1 through 100-4 cyclically fetches the discrete data sequentially input at predetermined intervals, and holds the value until the next fetching timing. For example, the first input data is held in the data holding section 100-1, and the second input data is held in the data holding section 100-2. The third and fourth input data are respectively held in the data holding sections 100-3 and 100-4. When the data holding operations are cyclically performed by the data holding sections 100-1 through 100-4, the subsequently input fifth data is fetched and held by the data holding section 100-1 which first input the data. Thus, the sequentially input data is cyclically held by the data holding section 100-1, etc. The data holding operations performed by the data holding sections 100-1 through 100-4 are performed in synchronization with the clock signals b1 through b4 shown in FIG. 9. Practically, the data holding section 100-1 operates in synchronization with the rise of the clock signal b1, the data holding section 100-2 operates in synchronization with the rise of the clock signal b2, the data holding section 100-3 operates in synchronization with the rise of the clock signal b3, and the data holding section 100-4 operates in synchronization with the rise of the clock signal b4.

Each of the step function generation sections 110-1 through 110-4 generates a step function having a value proportional to the value of the held data in synchronization with the data holding timing of the data holding sections 100-1 through 100-4 respectively one-to-one corresponding to the step function generation sections 110-1 through 110-4. The step function itself has the form as shown in FIG. 4, and the value of the step function is proportional to the data held in each of the data holding sections 100-1 through 100-4. Practically, each of the step function generation sections 110-1 through 110-4 generates a step function at timing synchronous with the rise of the clock signal cl shown in FIG. 9.

Therefore, assuming that data is input into a variation of an oversampling circuit shown in FIG. 11 at predetermined time intervals, the data holding timing of each of the data holding sections 100-1 through 100-4 is shifted corresponding to the data input intervals, and the timing of generating a step function by each of the step function generation sections 110-1 through 110-4 is also shifted. Then, the results of twice performing the digital integration on each of the generated step function are added. As a result, as in the above mentioned embodiments, plural pieces of interpolated data whose values change stepwise along the curve smoothly connecting the data input at predetermined time intervals can be obtained.

FIGS. 12A through 12I show the operation timing of generating a sampling function in the variation of the oversampling circuit shown in FIG. 11. As shown in FIG. 12A, when the data $D_1$, $D_2$, $D_3$, $D_4$, . . . are input at predetermined time intervals, each of the data holding sections 100-1 through 100-4 cyclically holds the data. Practically, the data holding section 100-1 fetches the first input data $D_1$, and holds it until the input data is cyclically held in the data holding sections (until the fifth data $D_5$ has been input) (FIG. 12B). In synchronization with the holding timing of the first data $D_1$, the step function generation section 110-1 generates a step function having a value proportional to the data $D_1$ (FIG. 12C).

Similarly, the data holding section 100-2 fetches the second input data $D_2$, and holds it until the input data is cyclically held in the data holding sections (until the sixth data $D_6$ has been input) (FIG. 12D). In synchronization with the holding timing of the second input data $D_2$, the step function generation section 110-2 generates a step function having a value proportional to the data $D_2$ (FIG. 12E).

The data holding section 100-3 fetches the third input data $D_3$, and holds it until the input data is cyclically held in the data holding sections (until the seventh data $D_7$ has been input) (FIG. 12F). In synchronization with the holding timing of the third input data $D_3$, the step function generation section 110-3 generates a step function having a value proportional to the data $D_3$ (FIG. 12G).

The data holding section 100-4 fetches the fourth input data $D_4$, and holds it until the input data is cyclically held in the data holding sections (until the eighth data $D_8$ has been input) (FIG. 12H). In synchronization with the holding timing of the fourth input data $D_4$, the step function generation section 110-4 generates a step function having a value proportional to the data $D_4$ (FIG. 12I).

Thus, there can be variations of step function generation unit, and the unit can be realized in any of the methods.

INDUSTRIAL APPLICABILITY

As described above, according to the present invention, output data whose values smoothly change can be obtained by generating a step function corresponding to input digital data, performing digital integration, and adding up the results. Thus, when the frequency of oversampling is set high, it is necessary only to speed up the operation of the digital integration. As a result, the configuration can be simplified and the cost of parts can be reduced without the conventional complicated configuration. Especially by resetting the integrating operation at a predetermined timing, error, etc. generated by an integrating operation, etc. can be prevented from being accumulated.

What is claimed is:

1. An oversampling circuit, characterized by comprising:
   a plurality of step function generation unit for generating a step function corresponding to each of plural pieces of digital data input at predetermined intervals in synchronization with an input timing of each of the plural pieces of digital data;
   a plurality of integrating unit for performing digital integration plural times on data having a value of the step function generated by each of said plurality of step function generation unit;
   a reset unit for resetting each operation of said plurality of integrating unit at a predetermined timing; and
   an addition unit for adding plural pieces of data obtained by said plurality of integrating unit.

2. An oversampling circuit, characterized by comprising:
   a plurality of step function generation unit for generating a step function corresponding to each of plural pieces of digital data input at predetermined intervals in synchronization with an input timing of each of the plural pieces of digital data;
   a plurality of integrating unit for performing digital integration plural times on data having a value of the step function generated by each of said plurality of step function generation unit;
   a reset unit for resetting each operation of said plurality of integrating unit at a predetermined timing; and
   an addition unit for adding plural pieces of data obtained by said plurality of integrating unit, characterized in that
   each value of the step function generated by said plurality of step function generation unit corresponds to each value obtained by differentiating each piecewise polynomial plural times for a predetermined sampling function configured by piecewise polynomials.

3. The oversampling circuit according to claim 2, wherein said step function comprises a positive region and a negative region set to have an equal area.

4. The oversampling circuit according to claim 3, wherein said sampling function is differentiable only once over the whole range and has values of local support.

5. The oversampling circuit according to claim 2, characterized in that
   said predetermined timing of a resetting operation by said reset unit is timing when the value of the sampling function is 0.

6. The oversampling circuit according to claim 4, characterized in that
   said predetermined timing of a resetting operation by said reset unit is a timing corresponding to a position in which the value of a sampling function of local support converges into 0 while maintaining differentiability.

7. The oversampling circuit according to claim 2, characterized in that said step function consists of eight piecewise sections in equal width with a weight of −1, +3, +5, −7, −7, +5, +3, and −1 in a predetermined range corresponding to said five digital data arranged at an equal interval, and that every two of eight weight coefficients corresponds to input intervals of the plural pieces of digital data.

8. An oversampling circuit, characterized by comprising:
   a plurality of step function generation unit for generating a step function corresponding to each of plural pieces of digital data input at predetermined intervals in synchronization with an input timing of each of the plural pieces of digital data;
   a plurality of integrating unit for performing digital integration plural times on data having a value of the step function generated by each of said plurality of step function generation unit;
   a reset unit for resetting each operation of said plurality of integrating unit at a predetermined timing; and
   an addition unit for adding plural pieces of data obtained by said plurality of integrating unit, characterized in that said digital integration is performed twice, and said integrating unit outputs data whose value changes like a quadric function.

9. An oversampling circuit, characterized by comprising:

a plurality of step function generation unit for generating a step function corresponding to each of plural pieces of digital data input at predetermined intervals in synchronization with an input timing of each of the plural pieces of digital data;

a plurality of integrating unit for performing digital integration plural times on data having a value of the step function generated by each of said plurality of step function generation unit;

a reset unit for resetting each operation of said plurality of integrating unit at a predetermined timing; and an addition unit for adding plural pieces of data obtained by said plurality of integrating unit, characterized in that said digital integration performed by said integrating unit is an operating process of accumulating input data, and n times of an oversampling process is performed by repeatedly performing the operating process n times in one period of inputting the digital data.

10. A digital to analog converter, comprising:

an oversampling circuit, said oversampling circuit comprising:

a plurality of step function generation unit for generating a step function corresponding to each of plural pieces of digital data input at predetermined intervals in synchronization with an input timing of each of the plural pieces of digital data;

a plurality of integrating unit for performing digital integration plural times on data having a value of the step function generated by each of said plurality of step function generation unit;

a reset unit for resetting each operation of said plurality of integrating unit at a predetermined timing; and an addition unit for adding plural pieces of data obtained by said plurality of integrating unit, comprising at a stage subsequent to said oversampling circuit:

voltage generation unit for generating an analog voltage corresponding to a value of data output by said integrating unit; and smoothing unit for smoothing the analog voltage generated by said voltage generation unit.

\* \* \* \* \*